(12) United States Patent
Yotsuhashi et al.

(10) Patent No.: US 7,351,906 B2
(45) Date of Patent: Apr. 1, 2008

(54) METHOD OF MANUFACTURING CRYSTALLINE FILM, METHOD OF MANUFACTURING CRYSTALLINE-FILM-LAYERED SUBSTRATE, METHOD OF MANUFACTURING THERMOELECTRIC CONVERSION ELEMENT, AND THERMOELECTRIC CONVERSION ELEMENT

(75) Inventors: Satoshi Yotsuhashi, Hyogo (JP); Hideaki Adachi, Osaka (JP); Yasunari Sugita, Osaka (JP); Tsutomu Kanno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 567 days.

(21) Appl. No.: 11/103,525

(22) Filed: Apr. 12, 2005

(65) Prior Publication Data

US 2005/0178424 A1 Aug. 18, 2005

Related U.S. Application Data

(63) Continuation of application No. PCT/JP2004/017006, filed on Nov. 16, 2004.

(30) Foreign Application Priority Data

Nov. 17, 2003 (JP) ............................. 2003-386604

(51) Int. Cl.
*H01L 37/00* (2006.01)
(52) U.S. Cl. ..................... 136/201; 136/236.1; 117/915
(58) Field of Classification Search ........ 136/200–242; 117/915; 438/739
See application file for complete search history.

(56) References Cited

U.S. PATENT DOCUMENTS 7,175,735 B2 * 2/2007 Park et al. .................. 156/305

FOREIGN PATENT DOCUMENTS

| JP | 62-177985 | 8/1987 |
|---|---|---|
| JP | 6-175358 | 6/1994 |
| JP | 6-175358 A | 6/1994 |
| JP | 10-74987 | 3/1998 |
| JP | 2002-203821 A | 7/2002 |
| JP | 2002-316898 A | 10/2002 |
| JP | 2004-88065 A | 3/2004 |

\* cited by examiner

*Primary Examiner*—Nam Nguyen
*Assistant Examiner*—Jeffrey Barton
(74) *Attorney, Agent, or Firm*—McDermott Will & Emery LLP

(57) ABSTRACT

It is often the case that a substrate suitable for epitaxial growth does not match a substrate desirable for the use in functional elements such as thermoelectric conversion elements or the like. The present invention makes it possible to separate a predetermined layered structure formed on a substrate therefrom through an action of water vapor. A method of manufacturing a crystalline film of the present invention includes the steps of: epitaxially growing on a substrate a crystalline film including a layered structure so that the layered structure comes into contact with the substrate; contacting water vapor supplied from a water vapor source with the layered structure in a chamber; and separating the layered structure that has been contacted with the water vapor from the substrate to obtain the crystalline film. The layered structure has a layer containing an alkali metal, and a layer containing an oxide of at least one element selected from the group consisting of Co, Fe, Ni, Mn, Ti, Cr, V, Nb, and Mo.

38 Claims, 13 Drawing Sheets

US 7,351,906 B2

METHOD OF MANUFACTURING CRYSTALLINE FILM, METHOD OF MANUFACTURING CRYSTALLINE-FILM-LAYERED SUBSTRATE, METHOD OF MANUFACTURING THERMOELECTRIC CONVERSION ELEMENT, AND THERMOELECTRIC CONVERSION ELEMENT

REFERENCE TO RELATED APPLICATION

This Application is a continuation of International Application No. PCT/JP2004/017006, whose international filing date is Nov. 16, 2004, which in turn claims the benefit of Japanese Application No. 2003-386604 filed on Nov. 17, 2003, the disclosures of which Applications are incorporated by reference herein. The benefit of the filing and priority dates of the International and Japanese Applications is respectfully requested.

BACKGROUND OF THE INVENTION

1. Field of the Invention

The present invention relates to a method of manufacturing a crystalline film and a crystalline-film-layered substrate, and to a method of manufacturing a thermoelectric conversion element using the foregoing method. The present invention also relates to a thermoelectric conversion element including a crystalline film obtained by epitaxial growth as a thermoelectric conversion layer.

2. Description of the Related Art

Thermoelectric power generation is a technology for directly converting thermal energy into electric energy with the use of the Seebeck effect, a phenomenon in which a temperature difference given to opposing ends of a substance causes a thermal electromotive force in proportion to the temperature difference. The thermal electromotive force can be taken out as electric power by connecting a load thereto and forming a closed circuit. This technology has been in practical use as power supplies for remote areas, power supplies for aerospace use, power supplies for military use, and so forth.

Thermoelectric cooling is a technology for causing heat absorption at a junction of two substances with the use of the Peltier effect, a phenomenon in which, when a current is passed through two substances having carriers with different signs, for example, a p-type semiconductor and an n-type semiconductor, that are connected thermally in parallel and electrically in series, the difference in the signs of the carriers reflects the difference in the directions of the heat flow. This technology has been in practical use as local cooling devices such as for cooling electronic devices in a space station, wine coolers, and the like.

Characteristics of a thermoelectric conversion material are evaluated by a figure of merit Z, or a figure of merit ZT that is made dimensionless by multiplying the figure Z by an absolute temperature. The figure of merit ZT is an index represented as $ZT = S^2/\rho\kappa$ by $S$, $\rho$, and $\kappa$ of a substance, where $S$ is Seebeck coefficient, $\rho$ is electric resistivity, and $\kappa$ is thermal conductivity. Using this index as a criterion, a material that has good thermoelectric conversion performance is currently pursued.

New applications of thermoelectric conversion elements, for example, local cooling for electronic devices such as mobile telephones and personal computers, power generating apparatuses for wearable electronic devices, or the like, will indispensably require a thermoelectric conversion element in which a thermoelectric conversion material is formed on a substrate in the form of a thin film. In the thermoelectric conversion element including a substrate and a thermoelectric conversion layer formed thereon, the heat conduction by the substrate becomes dominant over the heat conduction by the thermoelectric conversion layer. Therefore, even if a great temperature difference is produced at both ends of the thermoelectric conversion layer made of a thermoelectric conversion material having a high figure of merit, the heat conduction by the substrate lessens the temperature difference. The film thickness of the layer is at most several micrometers, whereas the thickness of the substrate is at least several hundred micrometers; thus, the performance deterioration due to the heat conduction by the substrate is a serious problem.

JP 62-177985A discloses a thermoelectric conversion element in which substrates made of glass or ceramic are stacked with an adhesive therebetween, the substrates having a p-type thermoelectric conversion layer formed on one surface thereof and an n-type thermoelectric conversion layer formed on the other surface.

JP 10-74987A discloses a thermoelectric conversion element in which a p-type thermoelectric conversion layer is formed on one surface of a film and an n-type thermoelectric conversion layer is formed on the other surface. As the film, a film made of a synthetic resin such as polyimide is disclosed in addition to a metal film.

The use of a substrate having a low thermal conductivity, such as glass or resin, can suppress the deterioration in thermoelectric conversion performance due to the heat conduction by the substrate. However, when resin or glass is made into a substrate, it is impossible to epitaxially grow a thermoelectric conversion layer on the substrate. Therefore, although heat conduction by the substrate can be suppressed, a problem remains that a thermoelectric conversion layer having good thermoelectric conversion performance cannot be formed.

Other than the above, JP 2002-316898A can be mentioned as a reference that relates to the present invention. Example 2 of this reference discloses that, by exposing a sapphire substrate on which gallium nitride is formed to water vapor, the gallium nitride and the sapphire substrate are separated.

SUMMARY OF THE INVENTION

The foregoing problem is resolved by separating a good quality thermoelectric conversion layer epitaxially grown on a substrate from the substrate, and transferring the thermoelectric conversion layer to another substrate made of resin or the like. It is not easy to peel off an epitaxially grown crystalline film from a substrate; therefore, in practice, removal of the substrate by plasma etching or the like is necessary to separate the crystalline film from the substrate. However, the removal of a substrate by plasma etching or the like tends to cause damages to the thin film and, moreover, makes it impossible to recycle the substrate. It may be possible to obtain a crystalline film separated from a substrate if a crystalline film is formed on a soluble substrate or on a soluble undercoating layer formed on a substrate and the soluble substrate or layer is removed using a solvent. However, since the materials of the soluble substrate or layer are limited, it is difficult to form a thermoelectric conversion layer thereon by epitaxial growth.

It is often the case that a substrate suitable for epitaxial growth does not match a substrate desirable when in use, not only for the thermoelectric conversion element but also for other functional elements. In view of this, the present invention proposes a new method of separating a thin film that has been formed on a substrate by epitaxial growth from the substrate, and accordingly, it is an object of the invention to provide a method of manufacturing a crystalline film and a method of manufacturing a crystalline-film-layered substrate, both of which use the foregoing method. It is another object of the present invention to provide a method of manufacturing a thermoelectric conversion element using the foregoing method and a new thermoelectric conversion element.

The present invention has been accomplished based on the new findings that an action of water vapor separates a predetermined layered structure formed on a substrate therefrom. Specifically, in accordance with the present invention, a method of manufacturing a crystalline film includes the steps of: epitaxially growing on a substrate a crystalline film including a layered structure so that the layered structure comes into contact with the substrate; contacting water vapor supplied from a water vapor source with the layered structure in a chamber; and separating the layered structure from the substrate to obtain the crystalline film.

The layered structure is characterized in that it includes a layer containing an alkali metal, and a layer containing an oxide of at least one element selected from the group consisting of Co, Fe, Ni, Mn, Ti, Cr, V, Nb, and Mo.

The present invention also provides a method of manufacturing a crystalline-film-layered substrate, including the steps of: epitaxially growing on a first substrate a crystalline film including a layered structure so that the layered structure comes into contact with the substrate; contacting water vapor supplied from a water vapor source with the layered structure in a chamber; and separating the layered structure that has been contacted with the water vapor from the first substrate while contacting the crystalline film with a second substrate, which is preferably made of resin or glass, to transfer the crystalline film from the first substrate onto the second substrate. The just-noted layered structure has the same features as that described above.

The present invention further provides another method of manufacturing a crystalline-film-layered substrate, including the steps of: epitaxially growing on a first substrate a first crystalline film including a layered structure so that the layered structure comes into contact with the first substrate; epitaxially growing on a second substrate a second crystalline film including a layered structure so that the layered structure comes into contact with the second substrate; contacting water vapor supplied from a water vapor source with the layered structure of the first crystalline film and the layered structure of the second crystalline film in a chamber while the first crystalline film and the second crystalline film are being in contact with a third substrate, which is preferably made of resin or glass; and separating the first crystalline film and the second crystalline film from the first substrate and the second substrate, respectively, while keeping the first crystalline film and the second crystalline film into contact with the third substrate, to transfer the first crystalline film and the second crystalline film from the first substrate and the second substrate onto the third substrate. The just-noted layered structure has the same features as that described above. It is recommended that the supplying water vapor to the layered structured of the first crystalline film and the layered structure of the second crystalline film be carried out while, for example, the third substrate is being sandwiched by the first crystalline film and the second crystalline film.

The present invention further provides methods of manufacturing a thermoelectric conversion element. Of the methods, a first method includes a step of obtaining a crystalline film that serves as a p-type thermoelectric conversion layer or an n-type thermoelectric conversion layer by the foregoing method of manufacturing a crystalline film. It is preferable that this crystalline film be arranged on a substrate made of resin or glass when in use. Of the foregoing methods, a second method includes a step of obtaining, by the foregoing method of manufacturing a crystalline film, a crystalline-film-layered substrate in which a crystalline film serving as a p-type thermoelectric conversion layer or an n-type thermoelectric conversion layer is disposed. Of the foregoing methods, a third method includes a step of obtaining, by the foregoing other method of manufacturing a crystalline film, a crystalline-film-layered substrate in which a first crystalline film serving as a p-type thermoelectric conversion layer and a second crystalline film serving as an n-type thermoelectric conversion layer are disposed.

Furthermore, the present invention provides a thermoelectric conversion element including: a substrate made of resin or glass and having a first surface and a second surface opposite to the first surface; a p-type thermoelectric conversion layer arranged on the first surface; an n-type thermoelectric conversion layer arranged on the second surface; an electrode electrically connecting the p-type thermoelectric conversion layer and the n-type thermoelectric conversion layer; wherein at least one selected from the p-type thermoelectric conversion layer and the n-type thermoelectric conversion layer is a thin film obtained by epitaxial growth and having a uniform crystal orientation.

The present invention also provides another thermoelectric conversion element including: two or more substrates made of resin or glass; two or more p-type thermoelectric conversion layers; two or more n-type thermoelectric conversion layers; and at least one electrode electrically connecting at least one selected from the two or more p-type thermoelectric conversion layers and at least one selected from the two or more n-type thermoelectric conversion layers, wherein: the two or more p-type thermoelectric conversion layers, the two or more n-type thermoelectric conversion layers, and the two or more substrates are stacked so that either the p-type thermoelectric conversion layers or the n-type thermoelectric conversion layers and the substrates are alternately arranged; and at least one selected from the two or more p-type thermoelectric conversion layers and the two or more n-type thermoelectric conversion layers is a thin film obtained by epitaxial growth and having a uniform crystal orientation.

According to the methods of the present invention, an epitaxially grown crystalline film is made separable from a substrate by an action of water vapor on the layered structure. Unlike the separation that accompanies the removal of a substrate through plasma etching or the like, these methods do not cause damages to the thin film and moreover makes it possible to recycle the substrate used for growing the thin film. According to the present invention, a good quality crystalline film that is epitaxially grown can be obtained, and this crystalline film functions as a p-type thermoelectric conversion layer or an n-type thermoelectric conversion layer by appropriately selecting its composition.

DETAILED DESCRIPTION OF THE INVENTION

Figure 1:
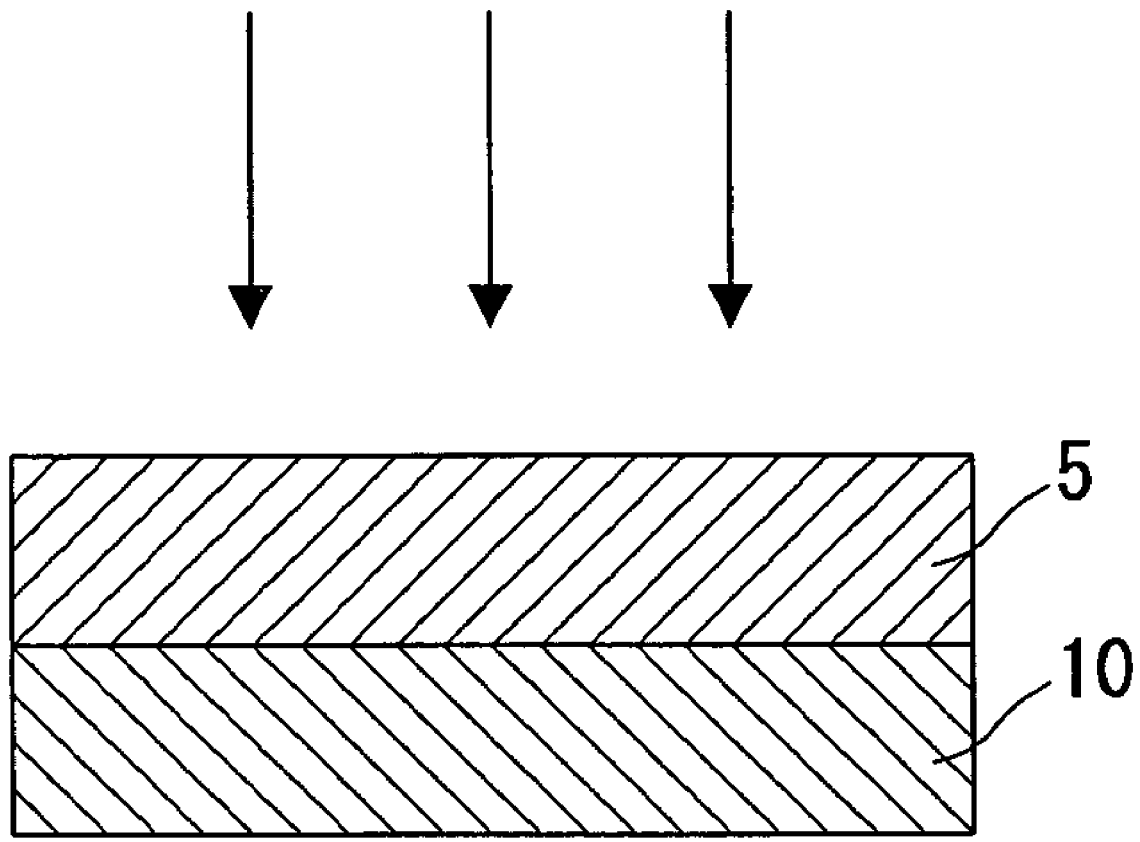
FIG. 1 is a cross-sectional view illustrating one example of a film deposition step by epitaxial growth.

It is impossible to separate a crystalline film that has been epitaxially grown on a substrate from the substrate only by a mechanical stress while maintaining the crystalline film in a usable condition. In the present invention, a crystalline film is epitaxially grown so as to include a predetermined layered structure, and a treatment in which the layered structure is supplied with water vapor is carried out. This treatment makes the crystalline film including the layered structure separable from the substrate.

At present, it is unable to explain details of the reason why the layered structure becomes separable from the substrate by contacting it with water vapor. However, taking into consideration the fact that contacting the layered structure with water (water in a liquid state) does not make the layered structure separable from the substrate or does not cause it to dissolve therein but allows it to remain on the substrate (cf. the later-described Comparative Examples), it is thought that at least, the expansion of the layered structure associated with the intrusion of water molecules may contribute to making the layered structure separable by contacting it with water vapor. In this respect, the invention is definitively different from JP 2002-316898A. Example 1 in JP 2002-316898A discloses that even using water in a liquid state can separate gallium nitride from a sapphire substrate.

By being brought into contact with water vapor sufficiently, a crystalline film including a layered structure separates from the substrate with very small stress, or in some case, automatically peels off. Depending on the tilt of the substrate, the substrate and the crystalline film may separate from each other by gravity. Thus, the separation step in the methods of the present invention does not necessarily require machinery or manpower. In addition, water vapor may be brought into contact with the layered structure while applying a stress such that the substrate and the crystalline film including the layered structure are separated, and the layered structure and the substrate may be separated immediately at the stage where the layered structure and the substrate has become separable by the stress.

It is recommended that the layered structure has a layer a containing an alkali metal, and a layer b containing an oxide of at least one element selected from the group consisting of Co, Fe, Ni, Mn, Ti, Cr, V, Nb, and Mo, and for example, it may have a structure in which the layer a and the layer b are alternately stacked.

Among such layered structures, there is a type in which the structure itself has a thermoelectric conversion function. The layered structure represented by the formula $A_xCoO_2$ serves as a p-type thermoelectric conversion layer. Here, A is an alkali metal, preferably sodium, and x is a numerical value within the range $0<x<1$. The layered structure represented by the formula $A_x(Ti_{1-y}Co_y)O_2$ serves as an n-type thermoelectric conversion layer. Here, A is an alkali metal, preferably sodium, x is a numerical value within the range $0<x<1$, and y is a numerical value within the range $0<y<1$. For example, a $Na_xCoO_2$ layer has a structure in which a $CoO_2$ layer, which is a conduction layer under a strongly correlated electron system, and a Na layer, which is a disordered insulating layer, are alternately stacked. This $Na_xCoO_2$ layer exhibits good thermoelectric conversion performance due to its high power factor owing to the $CoO_2$ layer and its low thermal conductivity owing to the Na layer.

It is not necessary that the whole crystalline film epitaxially grown on the substrate be composed of the foregoing layered structure. For example, the crystalline film may be a film including the layered structure, and a different structure being different from the layered structure and formed on the layered structure. This "different structure" is not particularly limited as long as it is a film that can be epitaxially grown on the just-noted layered structure, and examples thereof include a perovskite structure and a wurtzite structure. The use of the "different structure" makes it easy to introduce other characteristics than the thermoelectric conversion characteristic to the crystalline film.

A crystalline film that has piezoelectric characteristics can be obtained when a piezoelectric layer having a perovskite structure, for example, $BaTiO_3$, $KNbO_3$, $NaNbO_3$, $Pb(Zr, Ti)O_3$, $Pb(Zn, N, Ti)O_3$, $Pb(Mg, Nb, Ti)O_3$, or $(Pb, La)(Zr, Ti)O_3$, is formed on the foregoing layered structure.

A crystalline film that has pyroelectric characteristics can be obtained when a pyroelectric layer having a perovskite structure, for example, $BaTiO_3$, $LiNbO_3$, $LiTaO_3$, $(Pb, La)TiO_3$, or $(Pb, Ca)TiO_3$, is formed on the foregoing layered structure.

A crystalline film that has dielectric characteristics can be obtained when a dielectric layer having a perovskite structure, for example, $BaTiO_3$, $(Ba, Sr)TiO_3$, or $SrTiO_3$, is formed on the foregoing layered structure.

As the foregoing "different structure," it is possible to form a layer having a thermoelectric conversion function, for example, a ZnO layer doped with Al and having a wurtzite structure.

There are no restrictions on the substrate for growing a crystalline film (which hereinafter may be referred to as a "growth substrate") as long as the foregoing layered structure can be epitaxially grown; a ceramic substrate composed of sapphire or the like may be used as appropriate.

There are no particular restrictions on the film-forming method used for growing the crystalline film as long as the epitaxial growth of the crystalline film including the layered structure is possible; sputtering, laser ablation, chemical vapor deposition (CVD), or the like may be used as appropriate.

The film thickness of the crystalline film may be selected as appropriate according to the function that is to be given to the crystalline film. By employing the present invention, even a very thin crystalline film can be readily separated from the growth substrate. The film thickness of the crystalline film may be, for example, 5 nm or greater.

It is recommended that the contacting of the layered structure with water vapor be carried out in a chamber. Although it is simple and easy to supply water vapor from a water vapor source arranged in the chamber, water vapor may be supplied from a water vapor source arranged outside the chamber through piping. There are no particular restrictions on the water vapor source as long as it generates water vapor; water or an aqueous solution is sufficient for the purpose. In particular, in cases where the water vapor source is arranged in the chamber, it is recommended that the chamber be hermetically sealed and the water or the aqueous solution be accommodated in the chamber. A hermetically sealed chamber is advantageous for controlling temperature and humidity. The supplying of water vapor may be carried out while heating the interior of the chamber. The reason is that the time required for the layered structure to become separable can be relatively shortened if the amount of water vapor contacting the layered structure per unit time is increased.

It is recommended that the crystalline film separated from the growth substrate be used by arranging it on a substrate (which hereinafter may be referred to as a "working substrate") that is selected according to its use. For the reason stated above, a substrate composed of resin or glass is suitable as the working substrate for the thermoelectric conversion layer. Resin is a particularly preferable working substrate since it has a relatively low thermal conductivity and is easy to process. It is recommended that the crystalline film be fixed on a working substrate using an adhesive or the like as needed.

The contacting of the crystalline film including the layered structure and a working substrate may be carried out either before or after separating the crystalline film from the growth substrate. For example, the crystalline film may be completely separated from the growth substrate and thereafter arranged on a working substrate. Alternatively, for example, after water vapor has been brought into contact with the layered structure or while water vapor is being brought into contact therewith, a working substrate may be pressed against a surface of the crystalline film including the layered structure so that the crystalline film is separated from the growth substrate and is transferred to the working substrate. Alternatively, for example, it is possible to bring the crystalline film including the layered structure and the working substrate into contact with each other in advance and thereafter bring water vapor into contact with the layered structure.

Furthermore, while sandwiching the working substrate on both surfaces thereof by crystalline films including layered structures, water vapor may be brought into contact with the layered structures. In this case, it is recommended that a layered material composed of growth substrate/crystalline film/working substrate/crystalline film/growth substrate be arranged in the chamber.

Hereinbelow, the present invention is described in more details with reference to the drawings, taking as an example a case in which the crystalline film including the layered structure is a thermoelectric conversion layer.

As illustrated in FIG. 1, first, a thermoelectric conversion layer 5 having the predetermined structure is formed on a substrate (growth substrate) 10 by epitaxial growth using a vapor deposition technique such as sputtering. Herein, the description discusses the case of using the thermoelectric conversion layer 5 the entire layer of which is the predetermined structure, but the layer 5 may have a different structure as described previously in its upper part such that another function can be exhibited by the upper part.

Figure 2:
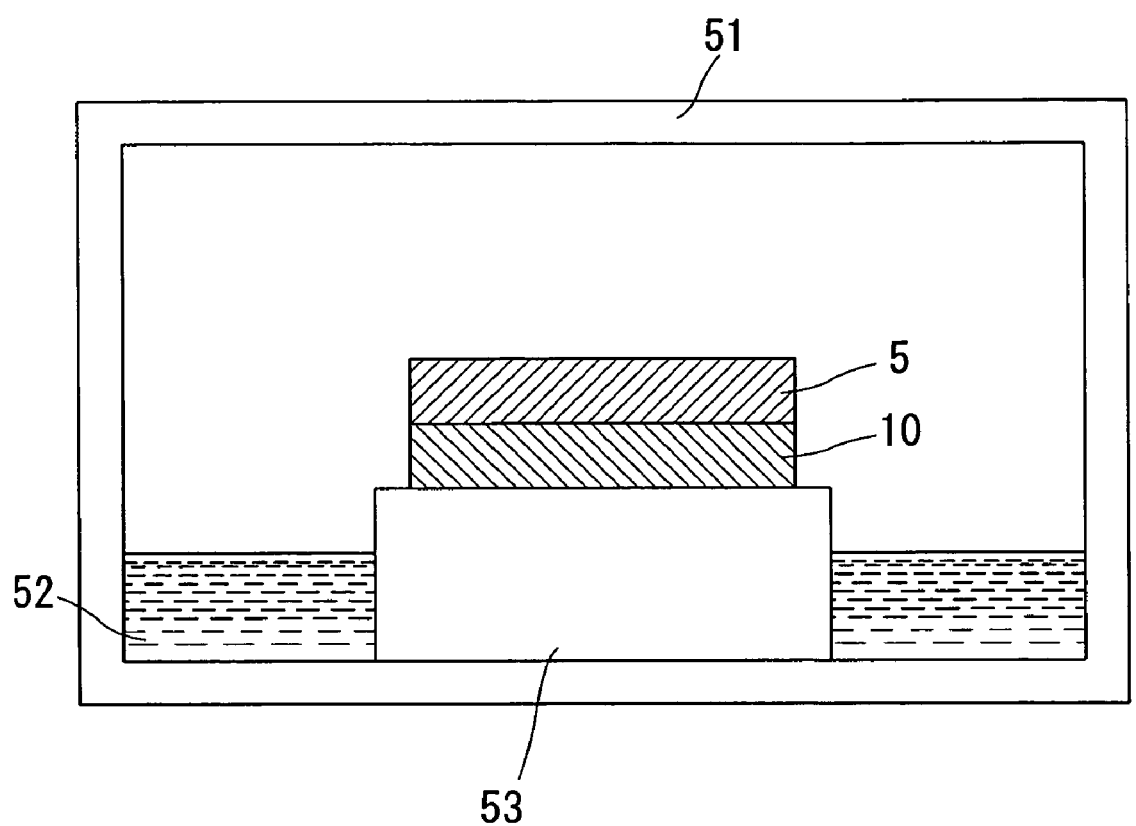
FIG. 2 is a cross-sectional view illustrating one example of a step of contacting a layered structure with water vapor.

Next, as illustrated in FIG. 2, the substrate 10 on which the thermoelectric conversion layer 5 has been formed is disposed in a chamber 51. It is recommended that water 52 serving as a water vapor source and a stage 53 provided with a retaining surface located above the surface level of the water 52 be accommodated in the interior of the chamber 51 in advance, and the substrate 10 on which the thermoelectric conversion layer 5 is formed be placed on the retaining surface of the stage 53. The chamber 51 is hermetically sealed and set side for a predetermined period, for example, for several days, at room temperature, and thereby, the thermoelectric conversion layer 5 peels off from the substrate 10. By accommodating an appropriate amount of water with respect to the size of the chamber 51, the relative humidity of the interior of the chamber 51 can be kept at about 100%. When the period until the peeling-off is required to be shortened, it is recommended that the interior of the chamber 51 be heated. If a constant temperature bath is used as the chamber 51 and the temperature of the interior of the chamber 51 is kept at 70° C. to 80° C., the thermoelectric conversion layer 5 peels off from the substrate 10 in 2 to 3 hours.

Figure 3:
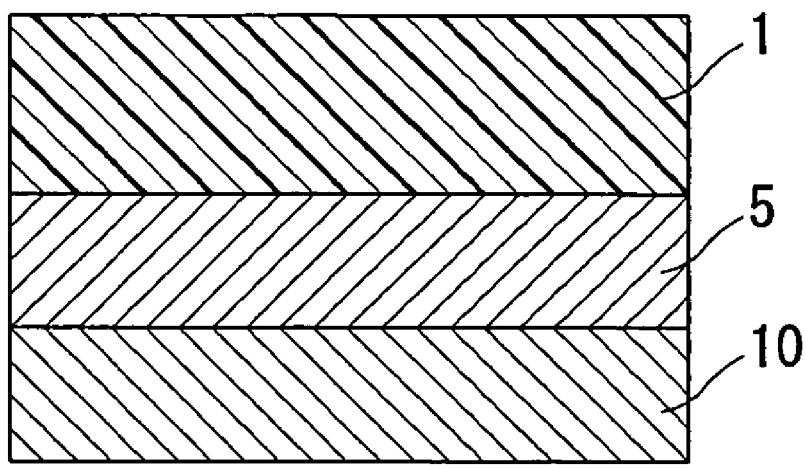
FIG. 3 is a cross-sectional view illustrating one example of a layered material that is brought into contact with water vapor.
Figure 4:
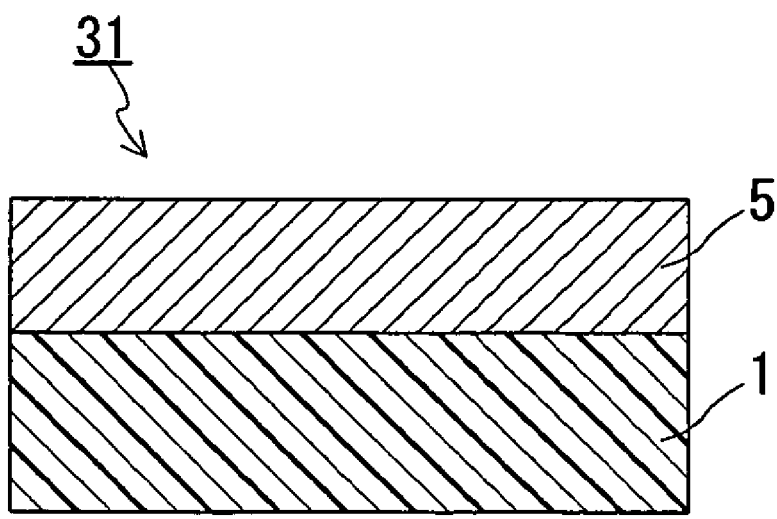
FIG. 4 is a cross-sectional view illustrating one example of a grown-film-layered substrate (p-type unit).

As illustrated in FIG. 3, a working substrate 1 may be arranged in the chamber 51 in a state in which it is overlaid on the upper surface of the thermoelectric conversion layer 5 formed on the growth substrate 10. An adhesive may be interposed at the interface between the substrate 1 and the thermoelectric conversion layer 5. This makes it possible to obtain a crystalline-film-layered substrate 31 that is composed of the substrate 1 and the thermoelectric conversion layer 5 arranged on the substrate 1 as illustrated in FIG. 4, immediately after the peeling-off of the thermoelectric conversion layer 5 from the substrate 10.

Figure 5:
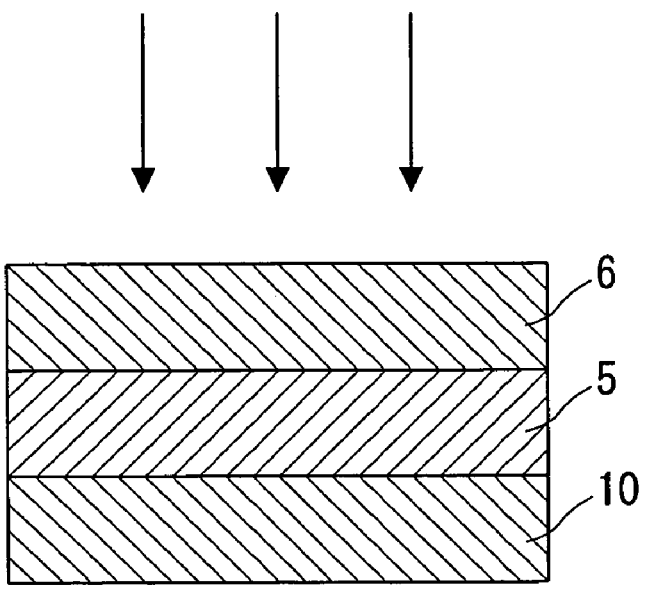
FIG. 5 is a cross-sectional view illustrating another example of the film deposition step by epitaxial growth.
Figure 6:
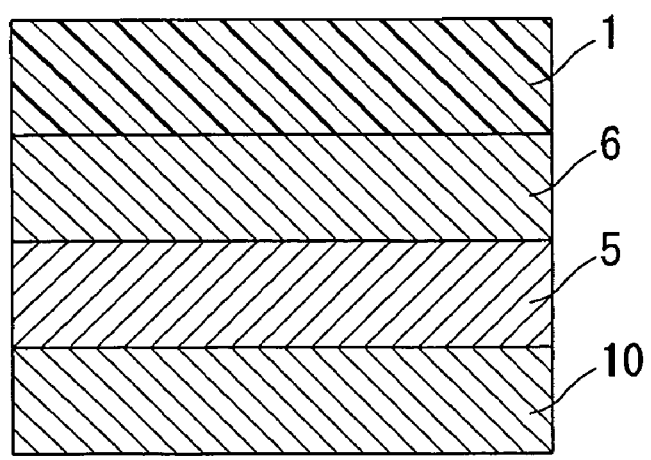
FIG. 6 is a cross-sectional view illustrating another example of a layered material that is brought into contact with water vapor.
Figure 7:
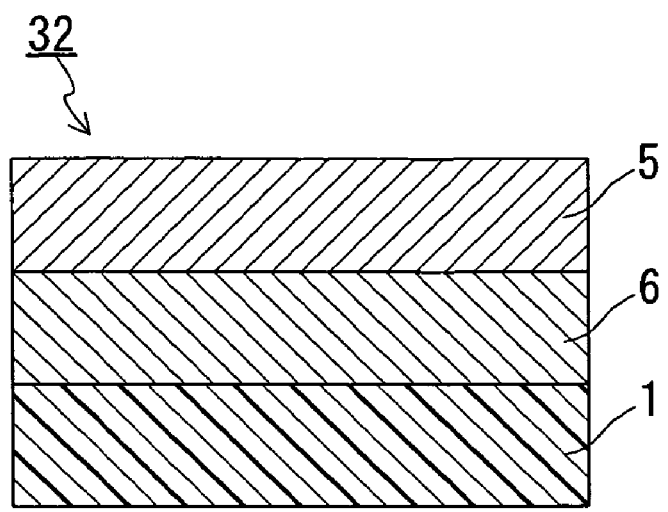
FIG. 7 is a cross-sectional view illustrating another example of a grown-film-layered substrate.

As illustrated in FIG. 5, a crystalline film 6 that has, for example, a perovskite structure may be epitaxially grown further on the crystalline film 5 having the layered structure, which has been grown on the substrate 10. In a similar manner to the foregoing, by supplying water vapor within the chamber after producing the layered material in which the upper surface of the crystalline film 6 is in contact with the working substrate 1 as illustrated in FIG. 6, it is possible to obtain a crystal-film-layered substrate 32 in which the crystalline film 6 having a perovskite structure and the crystalline film 5 having the layered structure are successively formed on the substrate 1, as illustrated in FIG. 7.

It should be noted that, as mentioned previously, the working substrate 1 may be brought into contact with the thermoelectric conversion layer 5 or the crystalline film 6 after water vapor has been supplied or while water vapor is being supplied.

Figure 8:
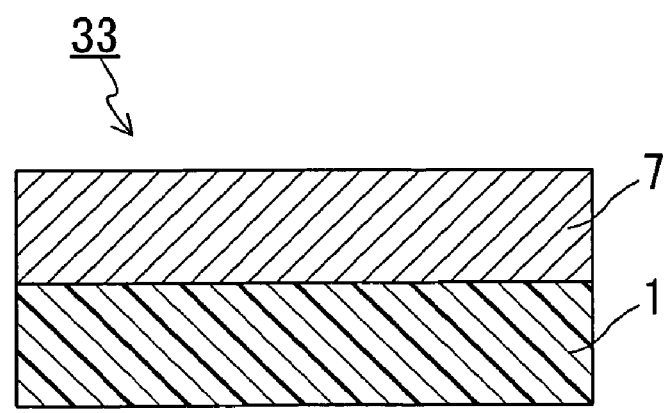
FIG. 8 is a cross-sectional view illustrating still another example of a grown-film-layered substrate (n-type unit).
Figure 9:
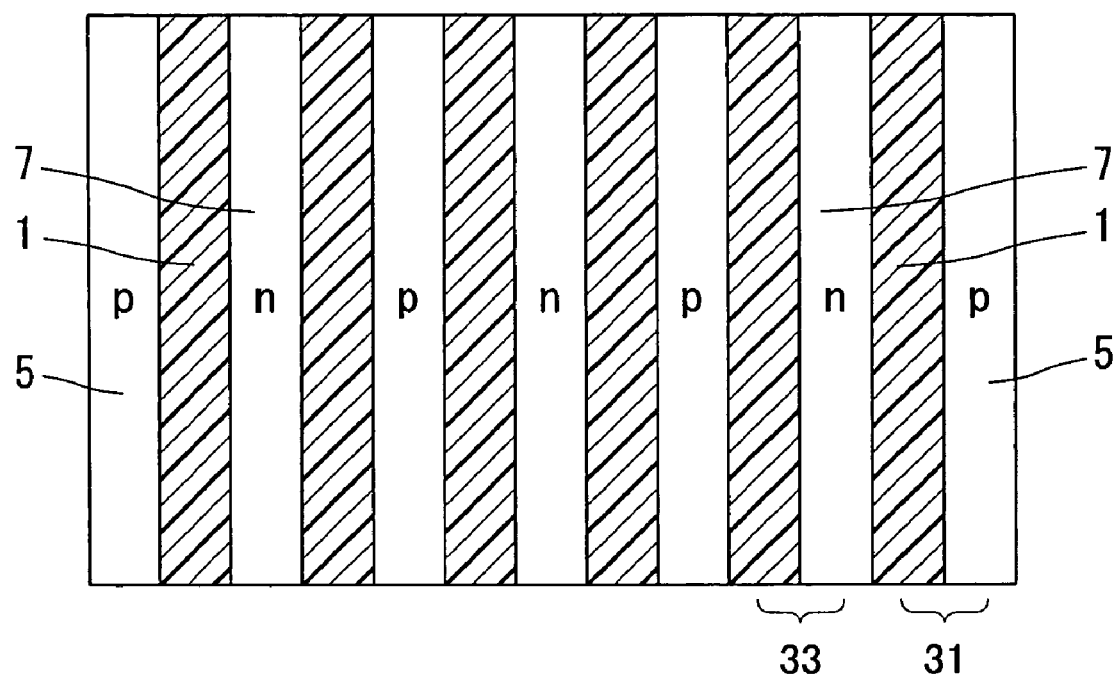
FIG. 9 is a cross-sectional view illustrating one example of a layered material of a grown-film-layered substrate.

In order to construct a thermoelectric conversion element, it is recommended that an n-type unit (n-type crystalline-film-layered substrate) 33 on which an n-type thermoelectric conversion layer 7 be fabricated as illustrated in FIG. 8, in addition to a p-type unit (p-type crystalline-film-layered substrate) 31 (cf FIG. 4) on which a p-type thermoelectric conversion layer 5 is formed. This unit 33 can be fabricated in the same manner as in the foregoing except that in place of the p-type thermoelectric conversion layer 5, the n-type thermoelectric conversion layer 7 is deposited on the growth substrate 1. By stacking the p-type unit 31 and the n-type unit 33 alternately, a layered material as illustrated in FIG. 9 is obtained.

Figure 10:
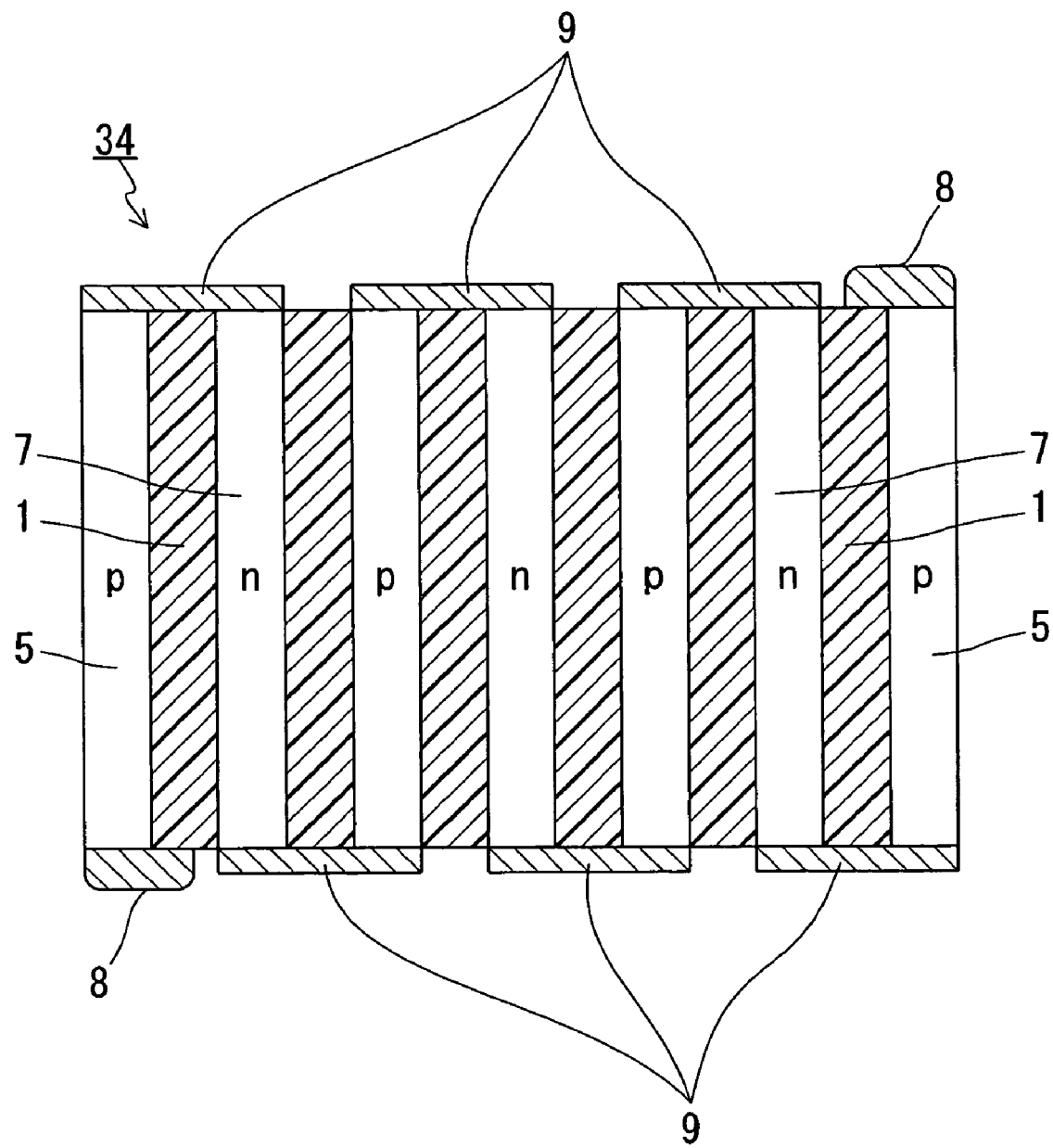
FIG. 10 is a cross-sectional view illustrating one example of a thermoelectric conversion element.

As illustrated in FIG. 10, when this layered material is provided with electrodes 9 that are formed on end faces of the substrates 1 so as to electrically connect p-type thermoelectric conversion layers 5 and n-type thermoelectric conversion layers 7, a thermoelectric conversion element 34 is obtained. In this element 34, the substrates 1 and either the p-type thermoelectric conversion layers 5 or the n-type thermoelectric conversion layers 7 are alternately stacked, and the p-type thermoelectric conversion layers 5 and the n-type thermoelectric conversion layers 7 are alternately arranged. These thermoelectric conversion layers 5 and 7, together with the electrodes 9, constitute a circuit in which the p-type thermoelectric conversion layers 5 and the n-type thermoelectric conversion layers 7 are alternately arranged, and heat sinks 8 are arranged at both ends of the circuit.

All the thermoelectric conversion layers 5 and 7 in this element 34 are formed by epitaxial growth, and their crystal orientation is uniform. As will be clearly understood from the above-described manufacturing method, the working substrate 1 merely plays the role of base for the thermoelectric conversion layers 5 and 7; therefore, the material thereof has few restrictions and materials having a low thermal conductivity such as resin and glass can be used. Thus, the thermoelectric conversion element 34 with good characteristics is obtained, which uses the substrate 1 that is excellent in insulation performance and the thermoelectric conversion layers 5 and 7 that are excellent in crystallinity.

Figure 11:
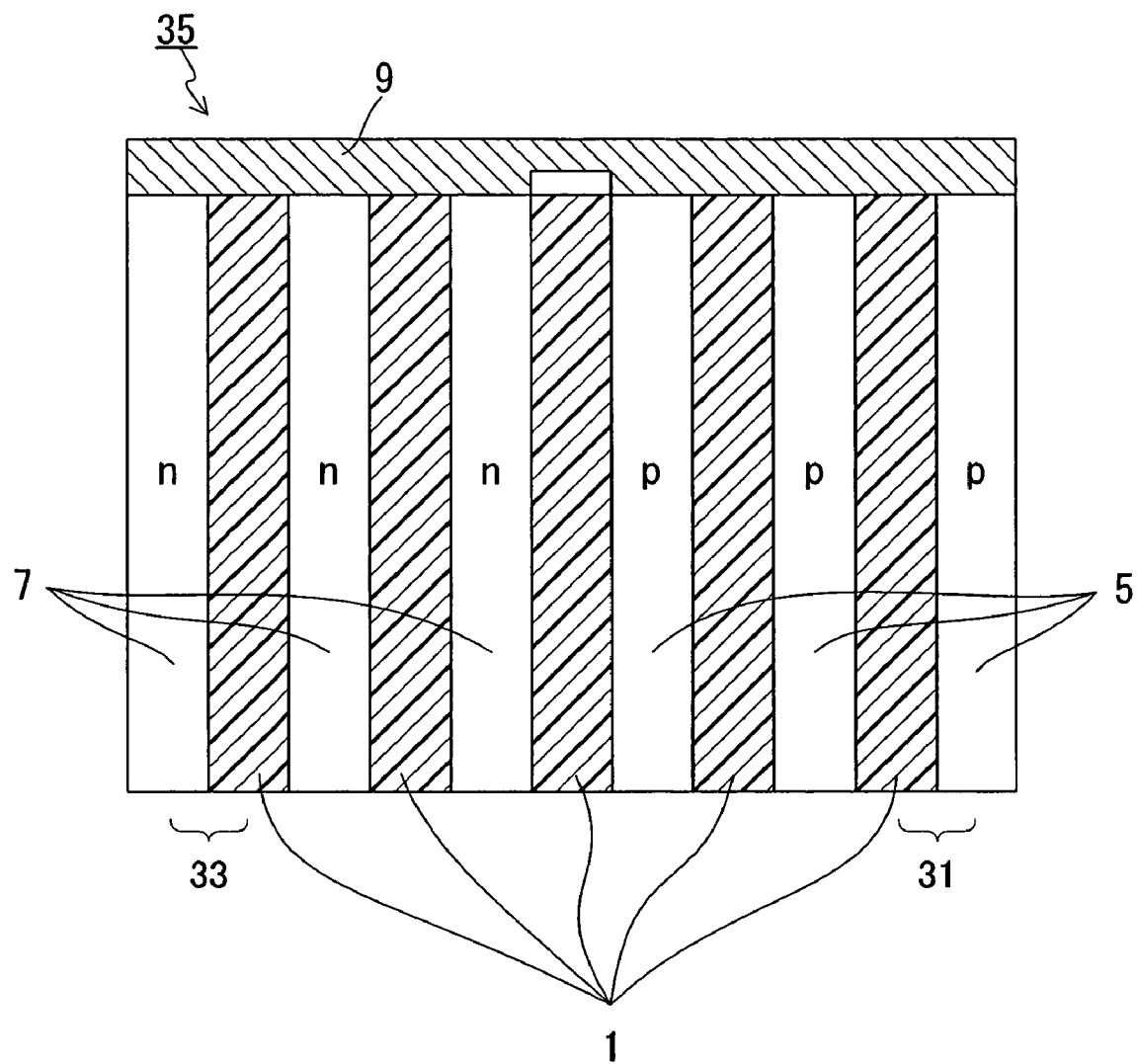
FIG. 11 is a cross-sectional view illustrating another example of the thermoelectric conversion element.

The p-type unit 31 and the n-type unit 33 need not be alternately stacked. As illustrated in FIG. 11, it is possible to employ a configuration in which two or more layered materials of p-type unit 31 and two or more layered materials of n-type unit 33 are stacked together. In this case, a single electrode 9 electrically connects two or more p-type thermoelectric conversion layers 5 and two or more n-type thermoelectric conversion layers 7. A thermoelectric conversion element 35 thus obtained has a high withstand current value and is not easily affected by breakage of the layers.

As has been described above, a method of manufacturing a thermoelectric conversion element is a method of obtaining a p-type unit 31 in which a crystalline film serving as the p-type thermoelectric conversion layer 5 is arranged, and an n-type unit 33 in which a crystalline film serving as the n-type thermoelectric conversion layer 7 is arranged, and stacking these units 31 and 33. In this case, it is recommended that two or more p-type units 31 and two or more n-type units 33 are stacked so that either a p-type thermoelectric conversion layer 5 or an n-type thermoelectric conversion layer 7 and a substrate 1 are alternately arranged; further, two or more p-type units 31 and n-type units 33 may be alternately stacked.

Figure 12:
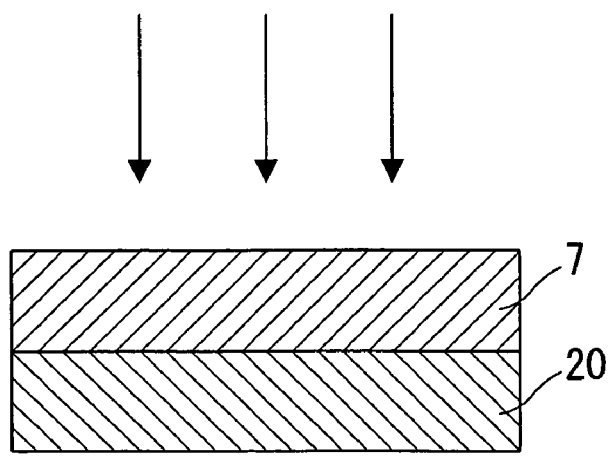
FIG. 12 is a cross-sectional view illustrating still another example of the film deposition step by epitaxial growth.
Figure 13:
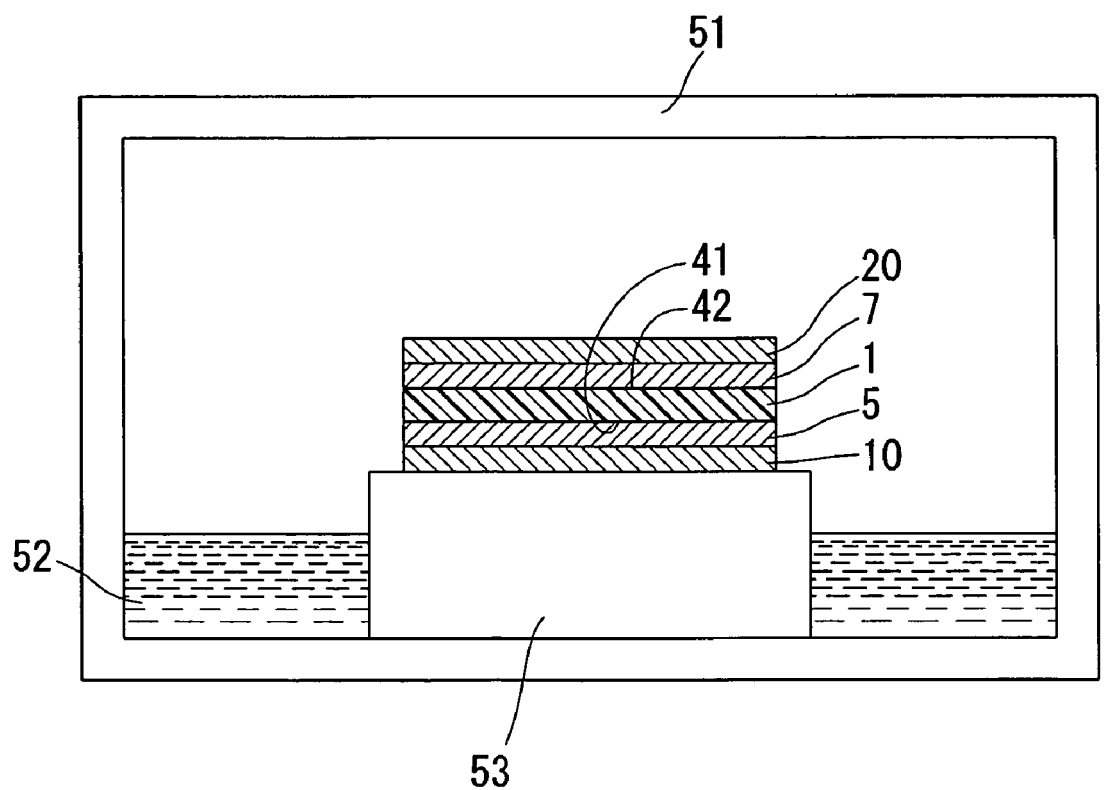
FIG. 13 is a cross-sectional view illustrating another example of the step of contacting a layered structure with water vapor.

It is also possible to transfer two or more thermoelectric conversion layers to a working substrate simultaneously. For such a transfer, first, a substrate 20 on which an n-type thermoelectric conversion layer 7 is epitaxially grown as illustrated in FIG. 12 is prepared in addition to the substrate 10 on which the p-type thermoelectric conversion layer 5 is epitaxially grown (see FIG. 1). Next, as illustrated in FIG. 13, the layered material is placed on the stage 53 in the chamber 51 in such a manner that the p-type thermoelectric conversion layer 5 comes into contact with a first surface 41 of the working substrate 1 and the n-type thermoelectric conversion layer 7 comes into contact with a second surface 42, which is opposite to the surface 41, and water vapor is supplied from water 52 to the thermoelectric conversion layers 5 and 7.

Figure 14:
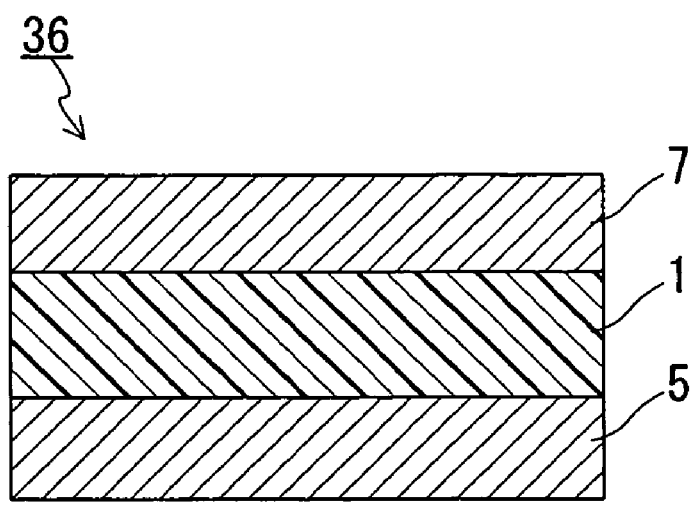
FIG. 14 is a cross-sectional view illustrating still another example of a grown-film-layered substrate (p-n unit).
Figure 15:
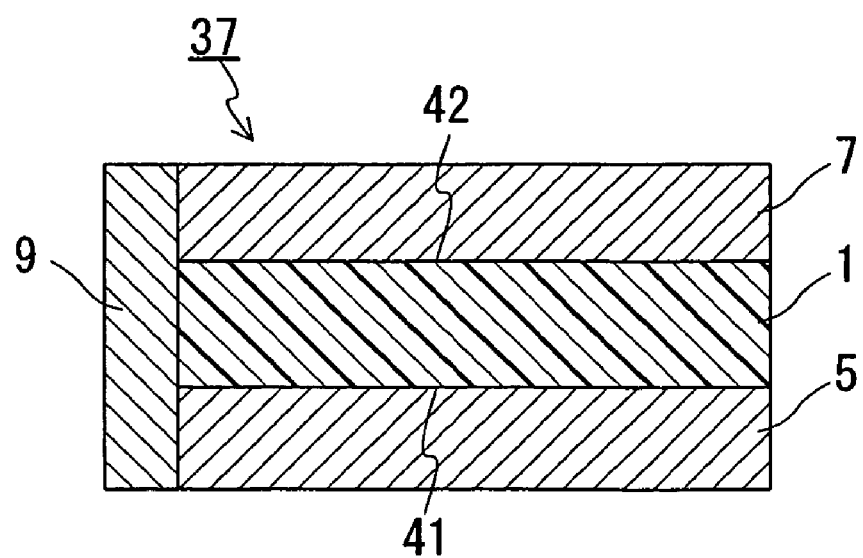
FIG. 15 is a cross-sectional view illustrating one example of a thermoelectric conversion element obtained using the substrate shown in FIG. 14.
Figure 16:
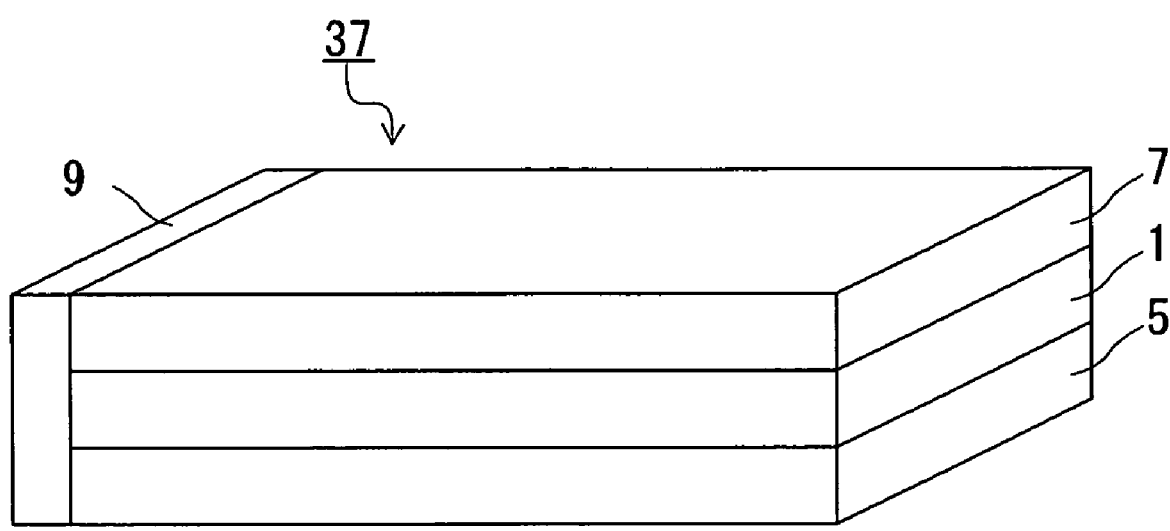
FIG. 16 is a perspective view of the element shown in FIG. 15.

Thus, the p-type thermoelectric conversion layer 5 peels off from the substrate 10 and the n-type thermoelectric conversion layer 7 peels off from the substrate 20, respectively, yielding a p-n unit 36 as shown in FIG. 14, which includes both the p-type thermoelectric conversion layer 5 and the n-type thermoelectric conversion layer 7. When an electrode 9 that electrically connects the thermoelectric conversion layers 5 and 7 is provided with this p-n unit 36, a thermoelectric conversion element 37 as shown in FIGS. 15 and 16 can be obtained, in which the p-type thermoelectric conversion layer 5 is formed on the first surface 41 of the substrate 1 and the n-type thermoelectric conversion layer is formed on the second surface 42 that is opposite to the surface 41.

Figure 17:
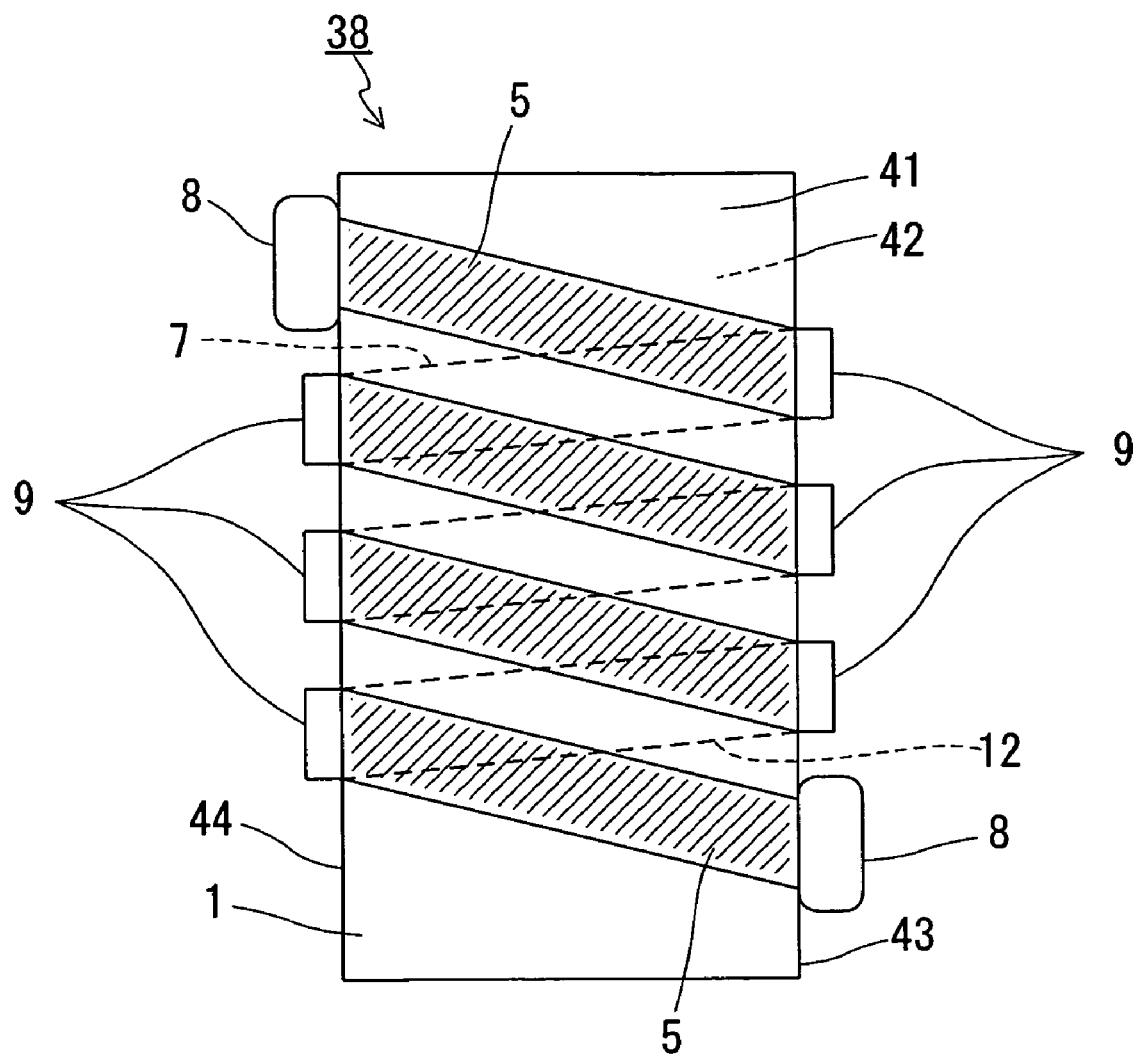
FIG. 17 is a plan view illustrating still another example of the thermoelectric conversion element.

The thermoelectric conversion layers 5 and 7 of the p-n unit 36 may be processed so as to form a predetermined pattern. This processing can be carried out by a step of removing portions of the p-type thermoelectric conversion layer 5 and the n-type thermoelectric conversion layer 7 to have a predetermined pattern. For example, by arranging electrodes 9 so as to connect the patterned thermoelectric conversion layers 5 and 7 with each other alternately as illustrated in FIG. 17, it is possible to obtain a thermoelectric conversion element 38 that includes two or more p-type thermoelectric conversion layers 5 arranged on the first surface 41 of the substrate 1, two or more n-type thermoelectric conversion layers 7 arranged on the second surface 42, and two or more electrodes 9 for electrically connecting the p-type thermoelectric conversion layers 5 and the n-type thermoelectric conversion layers 7, wherein the electrodes 9 electrically connect the p-type thermoelectric conversion layer 5 and the n-type thermoelectric conversion layer 7 alternately. In this element 38 too, it is preferable to arrange heat sinks 8 at both ends of the circuit.

In this element 38, the first surface 41 and the second surface 42 of the substrate 1 have a first edge 43 and a second edge 44, and the p-type thermoelectric conversion layers 5 and the n-type thermoelectric conversion layers 7 are arranged so as to traverse across the first surface 41 and the second surface 42 from the first edge 43 to the second edge 44. With this arrangement, the thermoelectric conversion layers 5 and 7 can be electrically connected by the electrodes 9 arranged at the edges 43 and 44.

Figure 18:
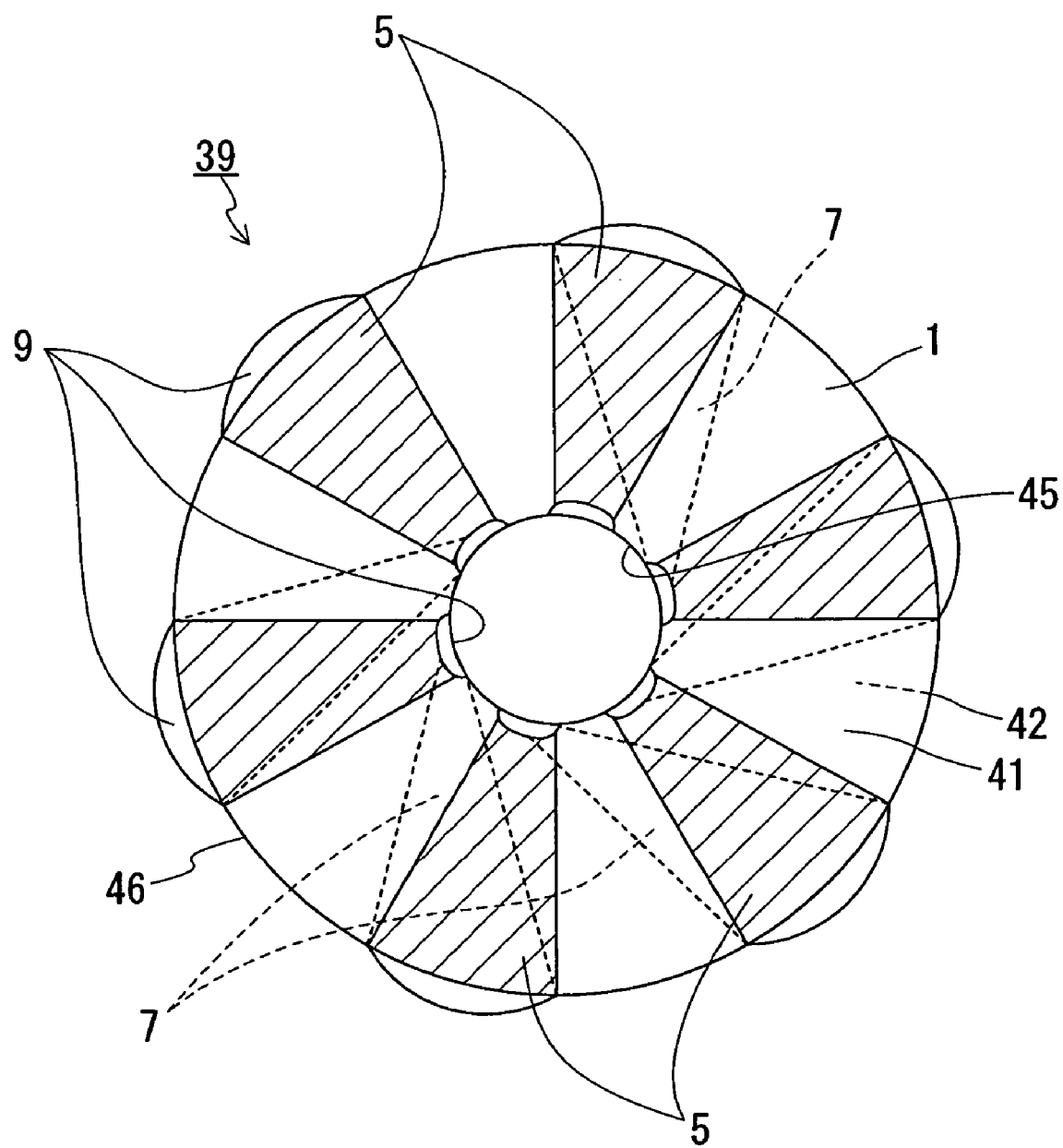
FIG. 18 is a plan view illustrating yet another example of the thermoelectric conversion element.

In a thermoelectric conversion element 39 shown in FIG. 18, the first surface 41 and the second surface 42 of the substrate 1 form ring-shaped surfaces having two edges, and the first edge forms an inner peripheral edge 45 while the second edge forms an outer peripheral edge 46. Two or more p-type thermoelectric conversion layers 5 and two or more n-type thermoelectric conversion layers 7 are arranged between these edges 45 and 46. This element 39 functions as a thermal power generation device, for example, when the inner peripheral edge 45 is arranged around a pipe through which heat flow passes. In addition, for example, by connecting an electrode 9 located at an end of the circuit with a dc power supply, it functions as, for example, a cooling device that cools the inner peripheral edge 45 side and releases heat at the outer peripheral edge 46 side. Also, when it is used with a device that collects light on the inner peripheral edge 45 side, the element can be used as an infrared ray sensor that detects infrared rays through an electromotive force generated by a temperature increase at the inner peripheral edge 45 side. Although the explanation has been omitted, the foregoing thermoelectric conversion elements can be used likewise as a thermal power generation apparatus, a local cooling device, an infrared ray sensor, and so forth.

The p-n unit 36 shown in FIG. 14 can also be fabricated using the p-type unit 31 and the n-type unit 33. In this case, it is recommended that the p-type unit 31 and the n-type unit 33 be connected to each other on a surface that is opposite the surface on which the p-type thermoelectric conversion layer 5 or the n-type thermoelectric conversion layer 7 is formed. A junction unit thus obtained results in a p-n unit in which the p-type thermoelectric conversion layer 5 and the n-type thermoelectric conversion layer 7 are arranged on the respective surfaces opposite to each other in the substrate 1 to which they are joined. The thermoelectric conversion elements 38 and 39 as shown in FIGS. 17 and 18 may be fabricated using the junction unit thus obtained.

Hereinbelow, the present invention is described in further detail with reference to examples.

EXAMPLE 1

A p-type thermoelectric conversion layer 5 represented by the formula $Na_{0.5}CoO_2$ was epitaxially grown on a single-crystal sapphire substrate 10 by sputtering, and an n-type thermoelectric conversion layer 7 represented by the formula $Na_{0.5}(Ti_{0.8}Co_{0.2})O_2$ was epitaxially grown on another single-crystal sapphire substrate 10. The sputtering was carried out using targets that were weighed to have the compositions of the above respective formulae and were mixed to be uniform under an atmosphere of Ar gas and $O_2$ gas being mixed at 3:1 at a pressure of 5 Pa, with the substrate temperature being kept at 700° C. By the sputtering for about 2 hours, the thickness of both of the thermoelectric conversion layers became about 900 nm.

The two substrates 10 thus obtained were placed into a chamber in which water was accommodated as in FIG. 2 and were set aside for 3 hours in a constant temperature bath at 70° C. Thereafter, a 0.1 mm-thick acrylic plate 1 was pressed against the surfaces of the thermoelectric conversion layers 5 and 7 to transfer the thermoelectric conversion layers 5 and 7 onto the acrylic plate 1. Thus, a p-type unit 31 and an n-type unit 33 were obtained.

Further, both units 31 and 33 were joined together by an epoxy-based adhesive at the surfaces that are opposite the surfaces on which the thermoelectric conversion layers 5 and 7 were formed, and an electrode 9 was formed by coating a silver paste on an end face of the acrylic plate 1 so that the thermoelectric conversion layers 5 and 7 were connected. Thus, a Peltier-type thermoelectric conversion element 37 was fabricated.

In addition, the thermoelectric conversion layers 5 and 7 on both surfaces of this element 37 were patterned using a photolithography technique before forming electrodes, and electrodes 9 were formed by coating a silver paste at locations where the patterned thermoelectric conversion layers 5 and 7 were connected to each other. Further, heat sinks 8 were disposed, and thus a Peltier-type thermoelectric conversion element 38 as shown in FIG. 17 was fabricated.

EXAMPLE 2

Peltier-type thermoelectric conversion elements 37 and 38 were fabricated in the same manner as in Example 1 except that a double layer film of a film represented by the formula $Na_{0.5}CoO_2$ and a ZnO film doped with Al at 2% was formed as the n-type thermoelectric conversion layer 7 in place of $Na_{0.5}(Ti_{0.8}Co_{0.2})O_2$. For the n-type thermoelectric conversion layer, a film represented by the formula $Na_{0.5}CoO_2$ was epitaxially grown to a thickness of 50 nm, and thereafter, on the resulting film, a c-axis oriented ZnO film doped with Al was grown to a thickness of 900 nm.

In place of the Al-doped ZnO film, it was also possible to epitaxially grow a film represented by the formula $(Sr_{0.9}La_{0.1})TiO_3$ on the film represented by the formula $Na_{0.5}CoO_2$. This film was epitaxially grown along a (111) plane.

In the case where $Na_{0.5}(Ti_{0.8}Co_{0.2})O_2$ was used in place of $Na_{0.5}CoO_2$ as the film having a layered structure as well, it was possible to epitaxially grow an Al-doped ZnO film.

COMPARATIVE EXAMPLE 1

A film represented by the formula $Sr_{0.4}CoO_2$ was epitaxially grown on a single-crystal sapphire substrate. This film was also deposited by sputtering. The sputtering was carried out using a target that was weighed to have the composition of the foregoing formula and mixed to be uniform under an atmosphere of Ar gas and $O_2$ gas being mixed at 3:1 at a pressure of 3 Pa, with the substrate temperature being kept at 700° C. By the sputtering for about 2 hours, the thickness of the thermoelectric conversion layer became about 900 nm.

Subsequently, this substrate was held in a chamber in the same manner as in Example 1, and water vapor was supplied to the above-described film. Nevertheless, this film did not peel off from the substrate, and the film could not be separated from the substrate.

COMPARATIVE EXAMPLE 2

A substrate on which a p-type thermoelectric conversion layer was formed and a substrate on which an n-type thermoelectric conversion layer was formed were obtained in the same manner as in Example 1. These substrates were kept in the state in which they were immersed in the water, not placed on the stage of the chamber. The result was that the thermoelectric conversion layers did not peel off, and the layers could not be separated from the substrates.

According to the present invention, restrictions on the substrates can be considerably alleviated in various elements using good quality crystalline films that are epitaxially grown. The present invention also makes it possible to obtain, for example, a thermoelectric conversion element that uses a thermoelectric conversion layer having good crystallinity and a substrate having low thermal conductivity.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a crystalline film, comprising the steps of:
   epitaxially growing on a substrate a crystalline film including a layered structure so that the layered structure comes into contact with the substrate;
   contacting water vapor supplied from a water vapor source with the layered structure in a chamber; and
   separating the layered structure that has been contacted with the water vapor from the substrate to obtain the crystalline film;
   wherein the layered structure includes a layer containing an alkali metal, and a layer containing an oxide of at least one element selected from the group consisting of Co, Fe, Ni, Mn, Ti, Cr, V, Nb, and Mo.

2. The method according to claim 1, wherein the layered structure is represented by the formula $A_xCoO_2$, where A is an alkali metal and x is a numerical value within the range $0<x<1$.

3. The method according to claim 1, wherein the layered structure is represented by the formula $A_x(Ti_{1-y}CO_y)O_2$, where A is an alkali metal, x is a numerical value within the range $0<y<1$.

4. The method according to claim 1, wherein the crystalline film includes the layered structure, and a different structure being different from the layered structure and formed on the layered structure.

5. The method according to claim 4, wherein the different structure is a perovskite structure or a wurtzite structure.

6. The method according to claim 1, wherein the water vapor source that supplies the water vapor is disposed in the chamber.

7. The method according to claim 6, wherein the water vapor source is water or an aqueous solution.

8. A method of manufacturing a crystalline-film-layered substrate, comprising the steps of:
   epitaxially growing on a first substrate a crystalline film including a layered structure so that the layered structure comes into contact with the substrate;
   contacting water vapor supplied from a water vapor source with the layered structure in a chamber; and
   separating the layered structure that has been contacted with the water vapor from the first substrate while contacting the crystalline film with a second substrate, to transfer the crystalline film from the first substrate onto the second substrate;
   wherein the layered structure includes a layer containing an alkali metal, and a layer containing an oxide of at least one element selected the group consisting of Co, Fe, Ni, Mn, Ti, Cr, V, Nb, and Mo.

9. The method according to claim 8, wherein the second substrate is a resin or a glass.

10. The method according to claim 8, wherein the layered structure is represented by the formula $A_xCoO_2$, where A is an alkali numerical value within the range $0<x<1$.

11. The method according to claim 8, wherein the layered structure is represented by the formula $A_x(Ti_{1-y}CO_y)O_2$, where A is an alkali metal, x is a numerical value within the range $0<y<1$.

12. The method according to claim 8, wherein the crystalline film includes the layered structure, and a different structure being different from the layered structure and formed on the layered structure.

13. The method according to claim 12, wherein the different structure is a perovskite structure or a wurtzite structure.

14. The method according to claim 8, wherein the water vapor source that supplies the water vapor is disposed in the chamber.

15. The method according to claim 14, wherein the water vapor source is water or an aqueous solution.

16. A method of manufacturing a crystalline-film-layered substrate, comprising the steps of:
   epitaxially growing on a first substrate a first crystalline film including a layered structure so that the layered structure comes into contact with the first substrate;
   epitaxially growing on a second substrate a second crystalline film including a layered structure so that the layered structure comes into contact with the second substrate;
   contacting water vapor supplied from a water vapor source with the layered structure of the first crystalline film and the layered structure of the second crystalline film in a chamber while the first crystalline film and the second crystalline film are in contact with a third substrate; and
   separating the first crystalline film and the second crystalline film from the first substrate and the second substrate, respectively, while keeping the first crystalline film and the second crystalline film in contact with the third substrate, to transfer the first crystalline film and the second crystalline film from the first substrate and the second substrate onto the third substrate;
   wherein the layered structure includes a layer containing an alkali metal, and a layer containing an oxide of at least one element selected the group consisting of Co, Fe, Ni, Mn, Ti, Cr, V, Nb, and Mo.

17. The method according to claim 16, wherein, while the third substrate is being sandwiched between the first crystalline film and the second crystalline film, the water vapor comes into contact with the layered structure of the first crystalline film and the layered structure of the second crystalline film.

18. The method according to claim 16, wherein the third substrate is a resin or a glass.

19. The method according to claim 16, wherein the layered structure is represented by the formula $A_xCoO_2$ or the formula $A_x(Ti_{1-y}CO_y)O_2$, where A is an alkali metal, x is a numerical value within the range $0<y<1$.

20. The method according to claim 16, wherein the crystalline film includes the layered structure, and a different structure being different from the layered structure and formed on the layered structure.

21. The method according to claim 20, wherein the different structure is a perovskite structure or a wurtzite structure.

22. The method according to claim 16, wherein the water vapor source that supplies the water vapor is disposed in the chamber.

23. The method according to claim 22, wherein the water vapor source is water or an aqueous solution.

24. A method of manufacturing a thermoelectric conversion element comprising a crystalline film that serves as a p-type thermoelectric conversion layer or an n-type thermoelectric conversion layer, the method comprising the steps of;
   epitaxially growing on a substrate a crystalline film including a layered structure so that the layered structure comes into contact with the substrate;
   contacting water vapor supplied from a water vapor source with the layered structure in a chamber; and separating the layered structure that has been contacted with the water vapor from the substrate to obtain the crystalline film;

wherein the layered structure includes a layer containing an alkali metal, and a layer containing an oxide of at least one element selected from the group consisting of Co, Fe, Ni, Mn, Ti, Cr, V, Nb, and Mo.

25. The method according to claim 24, further comprising a step of disposing the crystalline film on a substrate made of resin or glass.

26. A method of manufacturing a thermoelectric conversion element comprising a crystalline-film-layered substrate on which a crystalline film serving as a p-type thermoelectric conversion layer or an n-type thermoelectric conversion layer is disposed, the method comprising the steps of:

epitaxially growing on a first substrate a crystalline film including a layered structure so that the layered structure comes into contact with the substrate;

contacting water vapor supplied from a water vapor source with the layered structure in a chamber; and separating the layered structure that has been contacted with the water vapor from the first substrate while contacting the thermoelectric conversion layer with a second substrate, to transfer the crystalline film from the first substrate onto the second substrate;

wherein the layered structure includes a layer containing an alkali metal, and a layer containing an oxide of at least one element selected the group consisting of Co, Fe, Ni, Mn, Ti, Cr, V, Nb, and Mo.

27. A method of manufacturing a thermoelectric conversion element comprising a p-type crystalline-film-layered-substrate on which a crystalline film serving as a p-type thermoelectric conversion layer is disposed and n-type crystalline-film-layered-substrate on which a crystalline film serving as an n-type thermoelectric conversion layer is disposed, the method comprising the steps of:

obtaining the p-type crystalline-film-layered-substrate and the n-type crystalline-film-layered-substrate, and stacking the p-type crystalline-film-layered-substrate and the n-type crystalline-film-layered-substrate, wherein each step of obtaining the p-type crystalline-film-layered-substrate and the n-type crystalline-film-layered-substrate comprises the following steps:

epitaxially growing on a first substrate a crystalline film including a layered structure so that the layered structure comes into contact with the substrate;

contacting water vapor supplied from a water vapor source with the layered structure in a chamber; and separating the layered structure that has been contacted with the water vapor from the first substrate while contacting the thermoelectric conversion layer with a second substrate, to transfer the crystalline film from the first substrate onto the second substrate;

wherein the layered structure includes a layer containing an alkali metal, and a layer containing an oxide of at least one element selected from the group consisting of Co, Fe, Ni, Mn, Ti, Cr, V, Nb, and Mo.

28. The method according to claim 27, wherein two or more p-type crystalline-film-layered-substrates and two or more n-type crystalline-film-layered-substrates are stacked so that a substrate and either a p-type thermoelectric conversion layer or an n-type thermoelectric conversion layer are alternately arranged.

29. The method according to claim 28, wherein the two or more p-type crystalline-film-layered-substrates and the two or more n-type crystalline-film-layered-substrates are alternately stacked.

30. The method according to claim 27, wherein the p-type crystalline-film-layered-substrate and the n-type crystalline-film-layered-substrate are connected to each other on surfaces of the substrates that are opposite to the surfaces on which the p-type thermoelectric conversion layer and the n-type thermoelectric conversion layer are formed to obtain a junction unit in which the p-type thermoelectric conversion layer and the n-type thermoelectric conversion layer are arranged on respective surfaces opposite to each other.

31. The method according to claim 30, further comprising a step of removing portions of the p-type thermoelectric conversion layer and then-type thermoelectric conversion layer to form a predetermined pattern.

32. The method according to claim 27, further comprising a step of forming an electrode electrically connecting the p-type thermoelectric conversion layer and the n-type thermoelectric conversion layer.

33. The method according to claim 26, wherein a crystalline-film-layered-substrate in which a crystalline film is arranged on a substrate made of resin or glass, is obtained.

34. A method of manufacturing a thermoelectric conversion element comprising a crystalline-film-layered substrate on which a first crystalline film serving as a p-type thermoelectric conversion layer and a second crystalline film serving as an n-type thermoelectric conversion layer are disposed, the method comprising the steps of:

epitaxially growing on a first substrate a first crystalline film including a layered structure so that the layered structure comes into contact with the first substrate;

epitaxially growing on a second substrate a second crystalline film including a layered structure so that the layered structure comes into contact with the second substrate;

contacting water vapor supplied from a water vapor source with the layered structure of the first crystalline film and the layered structure of the second crystalline film in a chamber while the first crystalline film and the second crystalline film are in contact with a third substrate; and separating the first crystalline film and the second crystalline film from the first substrate and the second substrate, respectively, while keeping the first crystalline film and the second crystalline film in contact with the third substrate, to transfer the first crystalline film and the second crystalline film from the first substrate and the second substrate onto the third substrate;

wherein the layered structure includes a layer containing an alkali metal, and a layer containing an oxide of at least one element selected from the group consisting of Co, Fe, Ni, Mn, Ti, Cr, V, Nb, and Mo.

35. The method according to claim 34, wherein the crystalline-film-layered substrate is obtained in which the p-type thermoelectric conversion layer is arranged on a first surface and the n-type thermoelectric conversion layer is arranged on a second surface that is opposite to the first surface.

36. The method according to claim 34, further comprising a step of removing portions of the p-type thermoelectric conversion layer and then-type thermoelectric conversion layer to form a predetermined pattern.

37. The method according to claim 34, further comprising a step of forming an electrode electrically connecting the p-type thermoelectric conversion layer and the n-type thermoelectric conversion layer.

38. The method according to claim 34, wherein a crystalline-film-layered substrate in which a crystalline film is arranged on a substrate made of resin or glass, is obtained.

* * * * *

UNITED STATES PATENT AND TRADEMARK OFFICE
CERTIFICATE OF CORRECTION

PATENT NO. : 7,351,906 B2  
APPLICATION NO. : 11/103525  
DATED : April 1, 2008  
INVENTOR(S) : Satoshi Yotsuhashi et al.

Page 1 of 1

It is certified that error appears in the above-identified patent and that said Letters Patent is hereby corrected as shown below:

On the title page, under item "(56) References Cited", under "Foreign Patent Documents", please delete the third listed reference "JP 6-175358 6/1994".

In Column 13, Lines 22-23 (Claim 3), change "within the range $0<y<1$" to --within the range $0<x<1$, and y is a numerical value within the range $0<y<1$--.

In Column 13, Lines 55-56 (Claim 10), change "A is an alkali numerical value within the range $0<x<1$" to --A is an alkali metal and x is a numerical value within the range $0<x<1$--.

In Column 13, Lines 59-60 (Claim 11), change "x is a numerical value within the range $0<y<1$" to --x is a numerical value within the range $0<x<1$, and y is a numerical value within the range $0<y<1$--.

In Column 14, Lines 43-44 (Claim 19), change "x is a numerical value within the range $0<y<1$" to --x is a numerical value within the range $0<x<1$, and y is a numerical value within the range $0<y<1$--.

In Column 16, Line 10 (Claim 31), change "then-type" to --the n-type--.

In Column 16, Line 57 (Claim 36), change "then-type" to --the n-type--.

Signed and Sealed this

Twenty-seventh Day of January, 2009

JOHN DOLL  
*Acting Director of the United States Patent and Trademark Office*